United States Patent [19]

Penney

[11] Patent Number: 4,605,868
[45] Date of Patent: Aug. 12, 1986

[54] PEAK-TO-PEAK DETECTION APPARATUS

[75] Inventor: Bruce J. Penney, Portland, Oreg.

[73] Assignee: Tektronix, Inc., Beaverton, Oreg.

[21] Appl. No.: 786,132

[22] Filed: Oct. 7, 1985

Related U.S. Application Data

[63] Continuation of Ser. No. 479,390, Mar. 28, 1983, abandoned.

[51] Int. Cl.$^4$ ........................................... H03K 5/153
[52] U.S. Cl. .................................... 307/351; 307/259; 324/103 P; 328/162
[58] Field of Search ............. 307/351, 352, 353, 259; 328/162; 324/103 P

[56] References Cited

U.S. PATENT DOCUMENTS 4,109,198  8/1978  Ueno .................................... 307/351
4,362,996 12/1982  Priebe ................................... 307/351
4,373,140  2/1983  Chin .................................... 307/351

Primary Examiner—John Zazworsky
Attorney, Agent, or Firm—John Smith-Hill; Francis I. Gray

[57] ABSTRACT

A frequency domain characteristic of a system under test (SUT) is measured by using a digital signal corresponding to a swept frequency analog signal. In the case of a digital SUT, the digital signal is applied to the SUT, the output signal from the SUT is converted to analog form, and a measure of the peak-to-peak amplitude of the analog signal is derived. In the case of an analog SUT, the digital signal is converted to digital form, the analog signal is applied to the SUT, and a measure of the peak-to-peak amplitude of the output signal from the SUT is derived.

3 Claims, 16 Drawing Figures

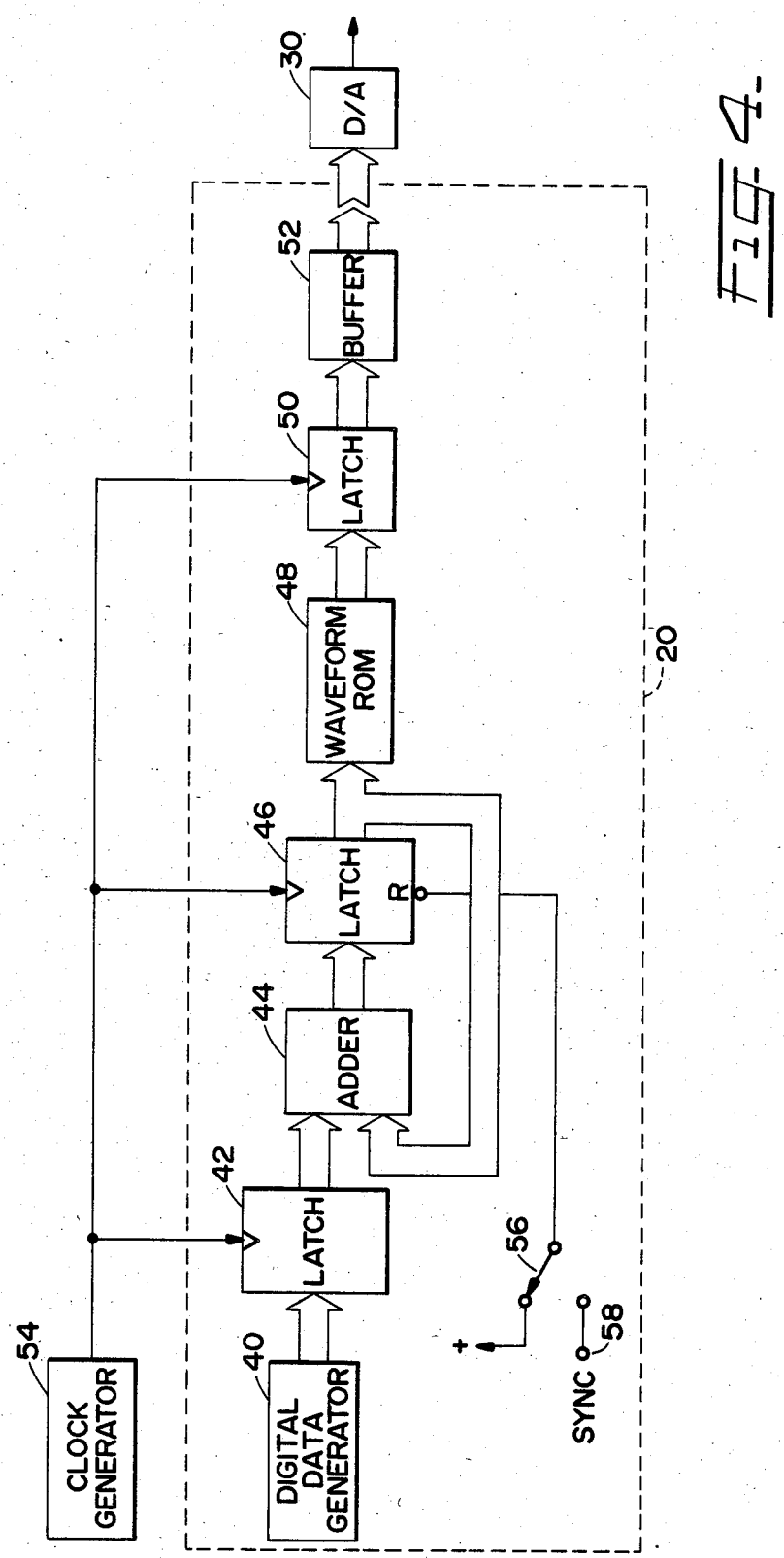

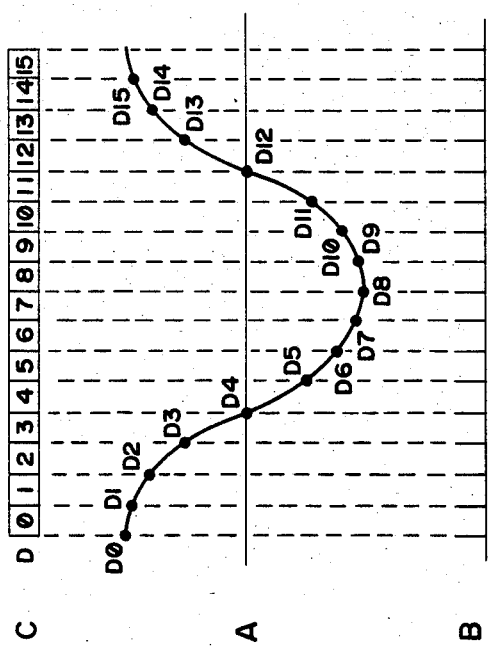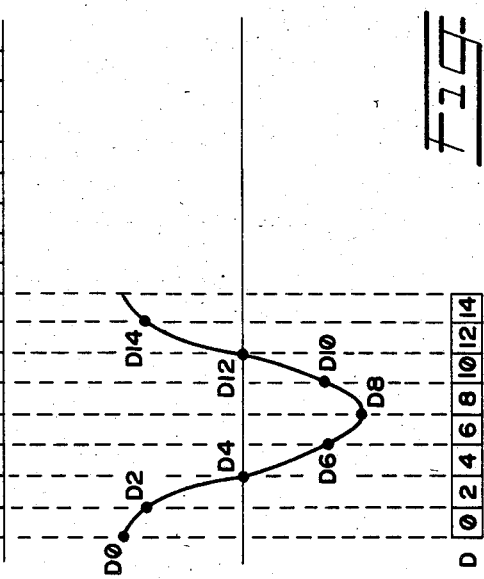
Fig. 5.
Fig. 6.

PEAK-TO-PEAK DETECTION APPARATUS

This is a continuation of application Ser. No. 479,390 filed Mar. 28, 1983 and now abandoned.

This invention relates to peak-to-peak detection apparatus.

BACKGROUND OF THE INVENTION

Use of digital techniques is popular in the field of electronics with the development of microprocessors, and the digital technique is used in analog equipments. A digital-to-analog (D/A) converter is employed to process a digital signal in the analog equipment. It is necessary to measure electronic characteristics of the equipment for insuring the performance thereof. One of the important electrical characteristics is a frequency domain (frequency and phase) response. A swept frequency sinewave test signal is useful for measuring the frequency domain characteristic of the analog equipments. However, since this test signal is analog, it cannot be applied to the digital equipments. The frequency response of the D/A converter may be measured by varying the clock frequency thereto, but the sin x/x correction will not hold constant with frequency variations of the clock.

There is described hereinafter a method of measuring a frequency domain characteristic of a digital system under test, comprising applying to the system under test a digital signal corresponding to a swept frequency analog signal, and deriving from an output signal of the system under test a measure of the peak-to-peak amplitude of the corresponding analog signal.

SUMMARY OF THE INVENTION

According to the present invention there is provided peak-to-peak detection apparatus comprising a peak-to-peak detector which has an input terminal and an output terminal and defines a signal path between the input terminal and the output terminal, said peak-to-peak detector including a first diode connected in said signal path and a second diode connected between said signal path and a reference potential level, whereby the detector generates at its output terminal an output signal representing the envelope of an input signal applied to its input terminal, said apparatus also comprising means for compensating for the effect on the operating characteristic of the detector of the change in incremental resistance of the diodes with signal level, the compensating means comprising means for determining the level of a predetermined point of the output signal of the detector, means for adjusting the d.c. level of said output signal to bring said predetermined point to a desired level, and means for amplifying the output signal by an amount dependent on the adjustment made to the d.c. level of the output signal.

BRIEF DESCRIPTION OF THE DRAWINGS

For a better understanding of the invention, and to show how the same may be carried into effect, reference will now be made, by way of example, to the accompanying drawings in which:

FIG. 4 is a block diagram of one part of the apparatus;

FIGS. 5 and 6 are respectively, graphs and a table for illustrating the operation of FIG. 4;

FIG. 16 is a schematic diagram of FIG. 10.

DETAILED DESCRIPTION

Figure 1:
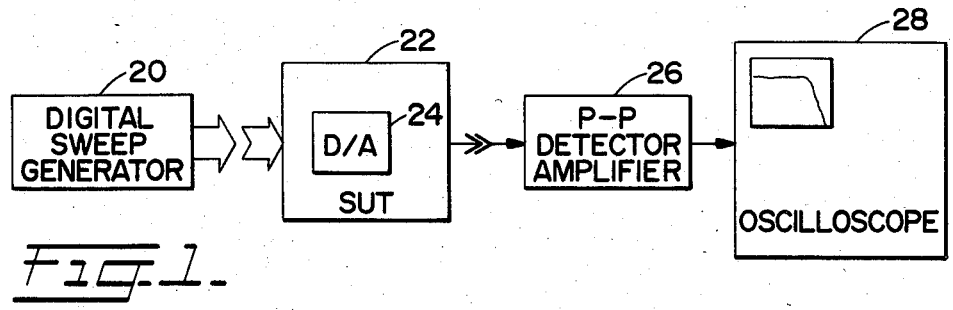
FIGS. 1, 2 and 3 are block diagrams of respective apparatus for measuring a frequency domain characteristic.

FIG. 1 shows a block diagram for explaining a first application of the present invention. Digital sweep generator 20 provides a sequential digital output signal representing a swept frequency sinewave signal, i.e., a signal of sinusoidal form, the frequency of which varies with time. The sweep generator 20 will be described in detail hereinafter with reference to FIGS. 4 through 8. The digital signal from the digital sweep generator 20 is, for example, ten bit parallel data having a frequency of 14.3 MHz and is applied to a system under test (SUT) 22 which may be a D/A converter, a digital processing system having a D/A converter 24 as an output stage, or an analog processing system having a D/A converter 24 as an input stage. The digital signal from generator 20 is converted to an analog signal by the SUT 22, is processed in digital form by the SUT 22 and converted to an analog signal by the D/A converter 24, or is converted to an analog signal by D/A converter 24 and processed in analog form by the SUT 22 depending on which of the three possible forms is taken by the SUT 22, respectively. The analog output signal from SUT 22 is applied to a peak-to-peak (P—P) detector/amplifier 26 which detects the P—P amplitude of the SUT output. P—P detector/amplifier 26 will be described in detail hereinafter by reference to FIGS. 10 through 15. The output level from P—P detector/amplifier 26 includes envelope gain correction factors, and is applied to the vertical deflection input of an oscilloscope 28. The horizontal position of the oscilloscope beam is time dependent, and the horizontal sweep frequency of the oscilloscope is equal to the repetition frequency of the swept frequency sinewave signal. Since the frequency of the sinewave signal provided by the digital sweep generator 20 varies with time, the displayed waveform represents the frequency response of the SUT 22. Thus, the frequency domain characteristic of SUT 22 can be measured without use of an analog-to-digital converter, and the use of the digital test signal provides an accurate evaluation of SUT 22.

Figure 2:
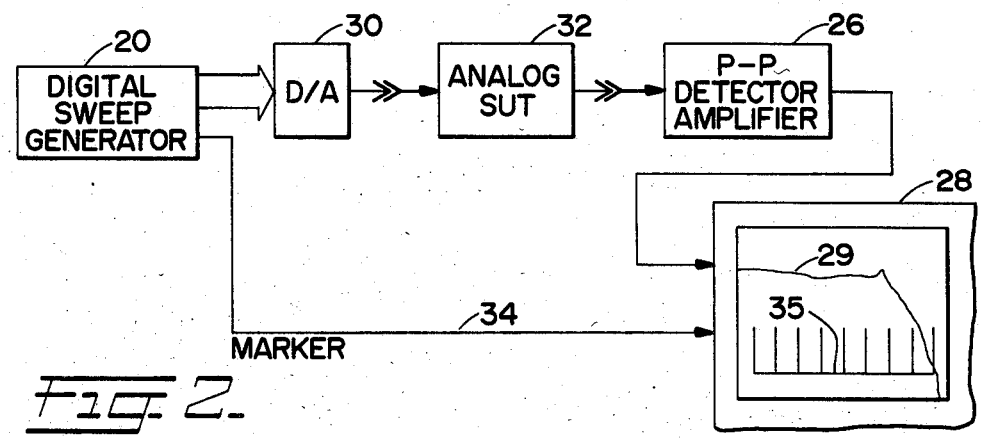
Figure 3:
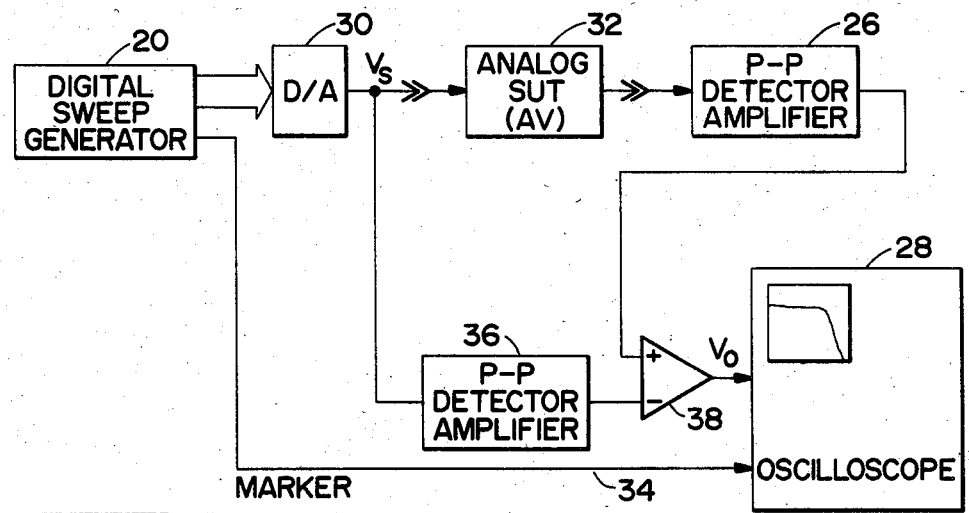
Figure 1B:
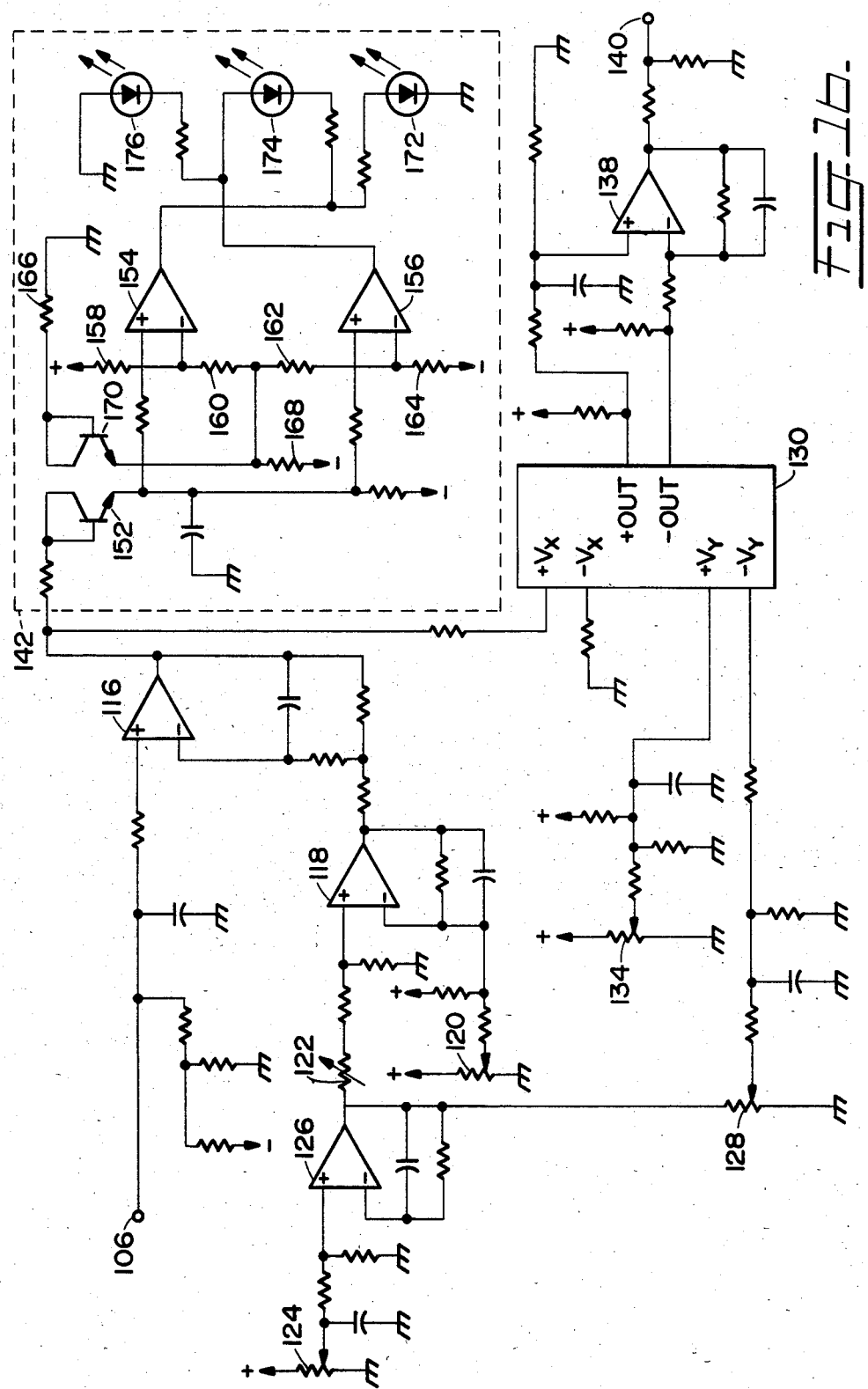

FIGS. 2 and 3 show block diagrams for explaining second and third applications of the present invention. These embodiments are similar to FIG. 1, so that the same reference numbers have been employed to designate like parts and only the differences will be discussed. In FIG. 2, a high quality standard D/A converter 30 converts the digital signal from the digital sweep generator 20 to a swept frequency sinewave analog signal, and this analog signal is applied to an analog SUT 32. The processed analog signal from the SUT 32 is applied to the P—P detector/amplifier 26 to derive the frequency domain characteristic information of the SUT 32. In this embodiment, the digital sweep generator 20 generates a marker signal (on line 34) coincident in time with a specific frequency of the swept frequency sinewave analog signal. The marker signal may be displayed by the oscilloscope 28 simultaneously with the output from the P—P detector/amplifier 26, as shown in FIG. 2, in which the waveform 35 of the marker signal is shown on the oscilloscope 28 with the trace 29 representing the output of the detector/amplifier 26. The individual markers may occur at, e.g., 1 MHz intervals. Since an analog circuit is not used for generating the swept frequency sinewave signal, the signal is high quality. The D/A converter 30 can be tested using the FIG. 1 circuit with the D/A converter connected as the SUT 22.

When the frequency response errors of the test signal source (digital sweep generator 20 and D/A converter 30) are significant compared to the expected errors of SUT 32, a differential mode employing the present technique may be employed to substantially eliminate the frequency response errors of the test signal. An additional P—P detector/amplifier 36, which has the same characteristic as the block 26, and a differential amplifier 38 are added to the FIG. 2 circuit to produce the FIG. 3 circuit. When the gain of SUT 32 is exactly one, errors in the frequency response of the test signal generator are cancelled by the common mode rejection of differential amplifier 38. It should be noted that the outputs from P—P detectors/amplifiers 26 and 36 are low frequency or d.c. signals, and so the frequency response of the differential amplifier 38 does not affect the measurement of the frequency domain characteristics of the SUT 32. The output voltage $V_o$ from the differential amplifier at any one frequency is given by:

$$V_o = (V_s \times A_v) - V_s$$

where $V_s$ is the output voltage from the D/A converter at that frequency and $A_v$ is the gain of the SUT 32 at that frequency. If the digital sweep generator 20 has a 0.5% frequency response error and the SUT 32 has a 2.0% error, the detected difference (ideally 2.0%) will actually be:

$$0.995 \times 0.98 - 0.995 = -0.0199$$

In this example, the 0.5% digital sweep generator error resulted in a measurement error of 2.0%−1.99%, namely only 0.01%. Thus, the frequency response error of the test signal is substantially cancelled.

FIG. 4 shows a basic block diagram of the digital sweep generator 20. The digital sweep generator 20 includes a digital data generator 40 which may be a counter, a memory or a thumb wheel switch. Digital data provided by the generator 40 is latched by a latch 42. A digital adder 44, such as type 74LS283 IC, adds the digital output data from the latch 42 and a second latch 46, and the resulting digital data from adder 44 is latched by the latch 46. The output data from the latch 46 is applied to the address terminals of a waveform memory 48 which stores digital data representing a cosine waveform, i.e., the memory 48 stores the cosine lookup table. The memory 48 may be a ROM, PROM (programmable ROM) EPROM (erasable PROM) or EEPROM (electrically erasable PROM). The data output from the waveform ROM 48 is applied to a buffer 52 through a latch 50. The latches 42, 46 and 50 may be ICs of type 74LS162, 74LS374 or 74LS377, and their clock terminals receive a clock signal from a clock generator 54. The clock frequency is, for example, 14.3 MHz. The reset terminal R of the latch 46 is connected to a positive voltage source + or a terminal 58 via a switch 56. The output from the buffer 52 is digital data representing the analog waveform determined by the contents of the ROM 48.

FIG. 5 shows waveforms for explaining the operation of the sweep generator 20. Waveform A is a cosine waveform. Waveform B represents the clock pulses provided by the generator 54. Because the clock pulses determine the times at which data is latched by the latch 50, they can be regarded as sampling pulses. Cross marks on the waveform A show the sampling points determined by the clock pulses, and D0 through D15 represent in digital form (for example 10 bits) the ordinate values of the sampling points. The P—P amplitude of the cosinewave A is "11 1111 1111" in the digital data. In order to simplify the description, one cycle of the cosinewave A is illustrated as including only sixteen sampling points, but a practical embodiment of the system would include more than sixteen sampling points, for example, 256 sampling points. The digital data D0 through D15 are stored in the address locations 00 through 15 respectively of the waveform ROM 48, as shown in FIG. 6.

Assuming that the digital data generator 40 generates continuously the digital data "01" (represented in the decimal code) and the contents of the latch 46 are initially "00", the data "01" and "00" are latched into the latches 42 and 46, respectively, on the first clock pulse. Simultaneously, the waveform ROM 48 receives the data "00" at its address terminals and generates the data D0 (at its data terminals). The adder 44 asynchronously outputs the digitally summed value of the data from the latches 42 and 46, so that the output from the adder 44 is "01" after the first clock pulse. When the second clock pulse occurs, the latch 46 stores the data "01" from the adder 44, and the latch 50 stores the data "D0" from the waveform ROM 48. After the second clock pulse, the waveform ROM 48 receives the data "01" at its address terminals and generates the data "D1" at its data terminals, and the adder 44 generates the data "02". It should be noted that the contents of the latch 42 do not change because the digital data generator 40 generates the constant value "01". When the third clock pulse occurs, the latches 46 and 50 latch the data "02" and "D1" respectively. After that, the adder 44 and waveform ROM 48 generate the data "03" and "D2" respectively. The above-described operation repeats to generate the sequential digital data. When the contents of the latch 46 are "15", the adder 44 generates the data "00" and thus returns to its initial condition. The data train derived from the buffer 52 is shown in FIG. 5C, and the corresponding analog waveform is shown in FIG. 5A. The frequency and amplitude of the analog waveform depend on the clock frequency and the reference voltage of the D/A converter.

If the output from the digital data generator 40 is continuously "02", the latch 42 stores the data "02" on the first clock pulse. The adder 44 and waveform ROM 48 generate the data "02" and "D0". When the second clock pulse occurs, the latches 44 and 50 latch the data "02" and "D0", respectively. After the second clock pulse, the adder 44 and waveform ROM 48 generate the data "04" and "D2", and so on. The data train from buffer 52 and the corresponding analog waveform from the D/A converter are shown in FIGS. 5D and E. If digital data generator 40 generates the data "03", the data train from buffer 52 is "D0", D3, D6, D9, D12, D15, D2, D5 ... ". It will be appreciated that the adder 44 and the latches 42 and 46 act as an address generator for the ROM 48.

As will be understood from the foregoing description, the frequency of the digital data from the buffer 52 is constant and is determined only by the clock frequency. However, the frequency of the corresponding analog waveform is determined by both the clock frequency and the setting of the digital data generator 40. Thus, it is not necessary to change the clock frequency of the D/A converter 30 in order to change the analog waveform frequency, so that the SUT does not need to change the electrical characteristics associated with the clock frequency, such as sin x/x correction. Since the digital sweep generator 20 shown in FIG. 4 is implemented using digital circuits only, the digital data from the buffer 52 has a high accuracy, and the analog waveform accuracy depends only on the D/A converter 30. If switch 56 selects terminal 58, which receives a sync signal, latch 46 is reset to provide an output "00" at every occurrence of the sync signal, so that the digital data from buffer 52 is synchronized with the sync signal. This allows the phase of the signal output by the D/A converter 30 to be reset to a predetermined value, e.g. 0°, at desired times. For example, in the evaluation of picture monitor displays, the phase of the test signal should be predictable on every field. Further utility is derived in use of phase measuring systems to reset phase at specific intervals. Reset would not normally be used in conjunction with the detector/amplifier 26 since the sweep signal has greater spectral purity when reset is not employed. A swept frequency analog waveform can be derived by varying the output data from the digital data generator 40 and converting the digital data provided by the buffer 52 to analog form.

Figure 7:
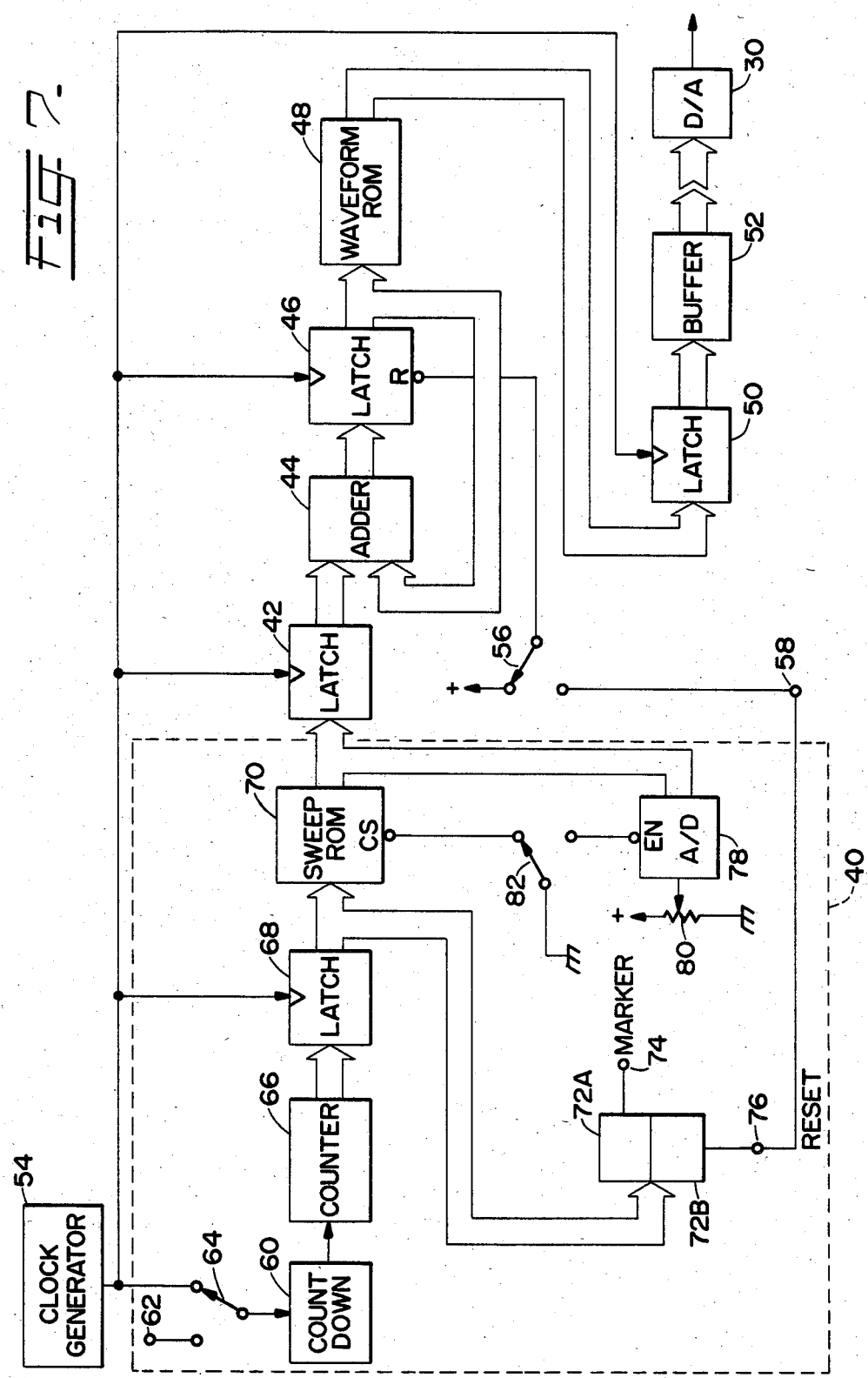
FIG. 7 is a block diagram showing part of FIG. 4 in greater detail.

FIG. 7 shows a detailed block diagram of the digital sweep generator 20, particularly the digital data generator 40. A count down circuit 60 is selectively connected to the clock generator 54 or an external clock terminal 62 via a switch 64. The output from the count down circuit 60 is counted by a counter 66 to provide address data which is applied to a latch 68. The latch 68 receives a clock pulse, and the output therefrom is applied to the address terminals of a sweep memory 70 and marker/reset circuit 72A, 72B. The memory 70 may be a ROM, PROM, EPROM or EEPROM, and it stores information of the sweep rate and linearity. The marker/reset circuit 72A, 72B generates the frequency marker and reset signals at terminals 74 and 76 in accordance with the data from the latch 68. An A/D converter 78 converts an analog voltage from a potentiometer 80 to digital data. The output from the sweep ROM 70 or the A/D converter 78 is applied to the latch 42. A switch 82 selectively grounds the chip select terminal CS of the sweep ROM 70 and the enable terminal EN of the A/D converter 78. The components 60 through 82 of FIG. 7 form digital data generator 40 of FIG. 5.

When the switch 82 selects the A/D converter 78, the sweep ROM 70 is disabled and the A/D converter 78 is enabled. In this instance, the latch 42 receives data only from the A/D converter 78, and the frequency of the analog waveform corresponding to the digital output of the buffer 52 can be controlled by the setting of the potentiometer 80. This constitutes a manual control mode of operation.

Figure 8:
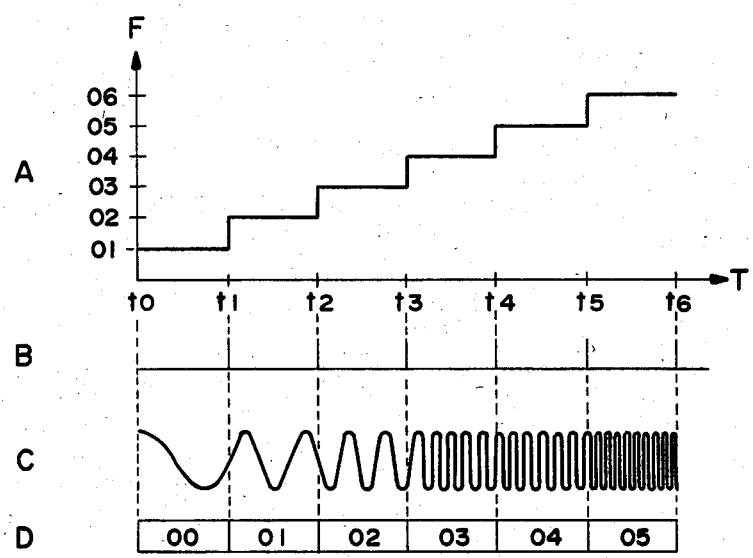
FIGS. 8 and 9 are graphs illustrating the operation of FIG. 7.

When the switch 82 selects the sweep ROM 70, the A/D converter 78 is disabled and the latch 42 receives the data only from the sweep ROM 70. If the contents of the sweep ROM 70 are linear sweep information, a linearly swept frequency sine waveform is derived from the D/A converter 30 as shown in FIG. 8. The waveform B is the output from the count down circuit 60 and the counter 66 counts the pulses of the waveform B in order to generate the address data shown by D. The address data D is latched into latch 68 on each clock pulse occurrence, and the addresses sweep the ROM 70. When the address data D is "00" at time $t_0$, the sweep ROM 70 generates the data "01" for providing digital data from the buffer 52 corresponding to a low frequency sinewave. When the data D becomes "01" at the $t_1$, the data from the sweep ROM 70 is "02" and the sinewave frequency is increased. These operations are repeated, whereby the digital data corresponding to the swept frequency sinewave shown in FIG. 8C is derived from the buffer 52. FIG. 8A shows the contents of the sweep ROM 70, i.e., the output data provided by the sweep ROM 70 in the intervals between clock pulses. It will be appreciated that the frequency of the sine waveform does not in fact change linearly with time, but changes in step-fashion. However, the increments are of equal size and each frequency value is maintained for the same period, and therefore the change in frequency approximates a linear function with respect to time.

Figure 9:
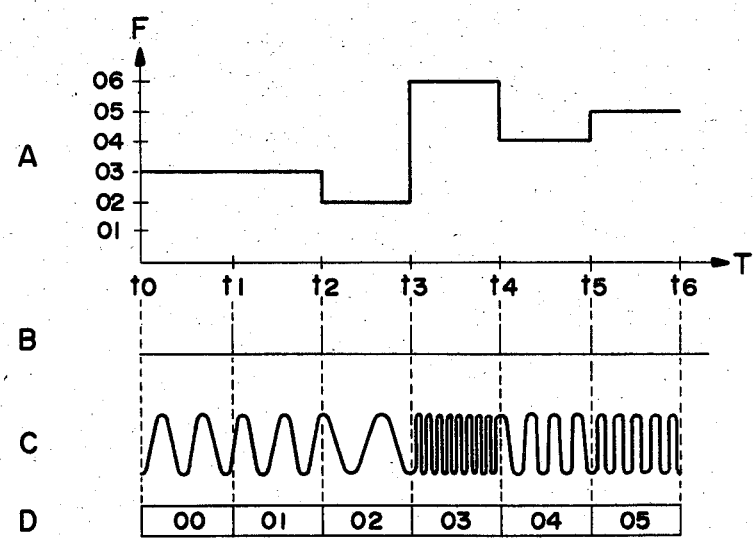

If the sweep rate and linearity information in the ROM 70 is not linear as shown in FIG. 9A, the output from the buffer 52 corresponds to a nonlinearly swept frequency sinewave as shown in FIG. 9C. When the switch 64 selects the terminal 62, the frequency changing time can be synchronized with an external signal provided at the terminal 62. In this instance, count down circuit 60 may be eliminated and the external signal directly applied to the counter 66 if the frequency of the external signal is much lower than that of the clock pulses from the clock generator 54.

The marker circuit 72A detects specific addresses provided to the sweep ROM 70 from the latch 68 and generates, at the terminal 74, a marker signal including individual markers which occur when the digital data from the buffer 52 corresponds to selected frequencies of the analog waveform. The reset circuit 72B detects the desired intervals of the address data from the counter 66, and generates a reset signal at the terminal 76. The reset signal may be applied to the latch 46 via the switch 58 to select output waveforms which are phase-reset at, for example, the horizontal TV scanning interval.

The latches 42, 46, 50 and 68 receive the clock signals in order to avoid errors due to propagation delay in each block. In order to change the shape of the analog waveform and the sweep rate/linearity, the contents of the ROMs 48 and 70 may be changed. If the sweep rate and linearity are as shown in FIG. 8, the output from converter 78 may be directly applied to latch 42.

Figure 10:
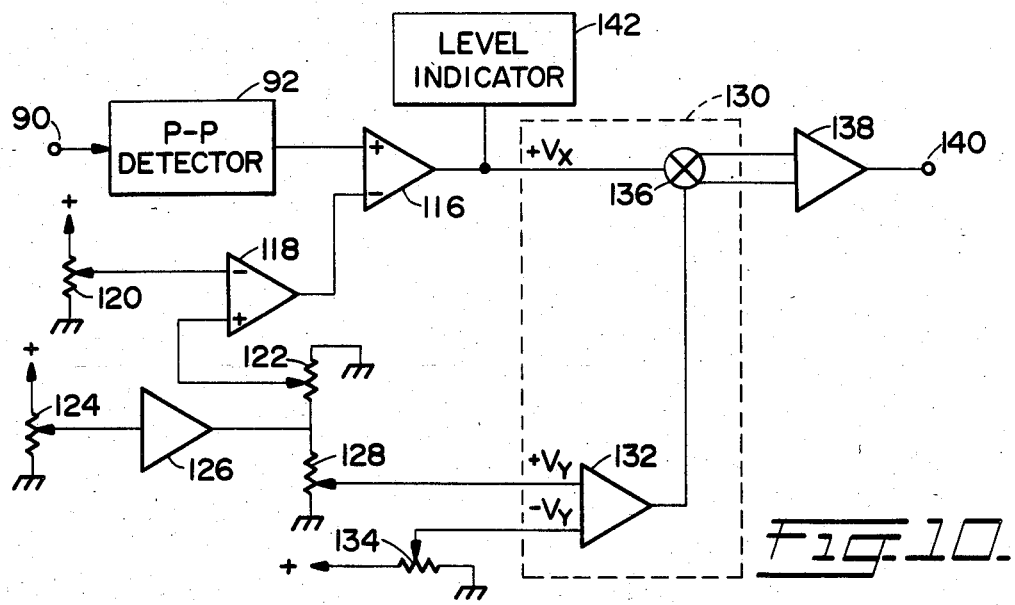
FIG. 10 illustrates, partly in block form and partly in schematic form, part of the apparatus of FIGS. 1 to 3.
Figure 11:
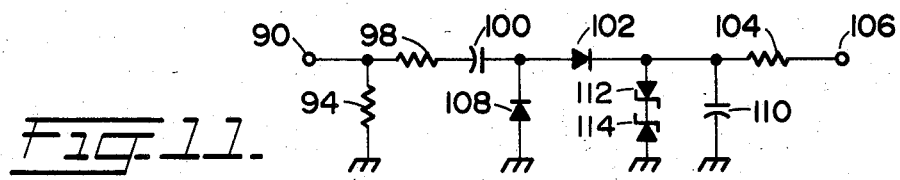
FIG. 11 is a schematic diagram of one component of FIG. 10.

FIG. 10 is a block diagram of the P—P detector/amplifier 26. The P—P detector/amplifier 36 is of like construction. The analog signal from the SUT is applied through a terminal 90 to a P—P detector 92 which is of conventional type as shown in FIG. 11. FIG. 11 shows an input resistor 94 connected between the input terminal 90 and ground. A series circuit consisting of a small resistor 98, a capacitor 100, a diode 102, and an output resistor 104 is inserted between the input terminal 90 and an output terminal 106. The junction between the capacitor 100 and the diode 102 is grounded via a diode 108, and the junction between the diode 102 and the resistor 104 is grounded via a capacitor 110. Protection Zener diodes 112 and 114 are connected in parallel with the capacitor 110.

Returning to FIG. 10, the output from P—P detector 92 is applied to the non-inverting terminal of an input amplifier 116 having its inverting terminal receiving the output from an offset amplifier 118. The inverting and non-inverting terminals of the amplifier 118 are respectively connected to a potentiometer 120 and a potentiometer 122 which act as a small signal offset controller and a large signal offset controller, respectively. A potentiometer 124 acting as a level controller applies a d.c. voltage to the junction of the potentiometer 122 and a potentiometer 128 through a buffer amplifier 126. The potentiometer 128 acts as a large signal gain controller. A variable gain amplifier 130 includes a differential amplifier 132 which receives the voltage from the center tap of the potentiometer 128 and also receives the voltage from the center tap of a potentiometer 134 acting as a small signal gain controller. The amplifier 130 further includes a multiplier 136 which multiplies the output from input amplifier 116 by the output from the differential amplifier 132 for controlling the output amplitude. The push-pull output from the variable gain amplifier 130 is applied to an output terminal 140 through an output amplifier 138. A level indicator 142 indicates the output level from the input amplifier 116. The amplifier section of P—P detector/amplifier 26 consists of the amplifiers 116, 118, 126, 130 and 138.

Figure 12:
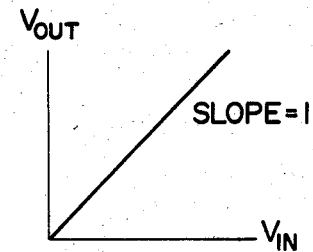
FIGS. 12–15 are graphs illustrating operation of FIG. 10.
Figure 13:
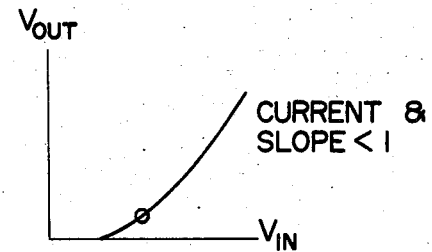

The output from the P—P detector 92 is a d.c. output voltage $V_{out}$ which follows the envelope of the a.c. input signal $V_{in}$ at the terminal 90. An ideal detector would have $V_{out}/V_{in} = 1$ as shown in FIG. 12. However, due to the turn on voltages and dynamic impedances of the diodes 102 and 108 in the P—P detector 92, the output d.c. level from the P—P detector 92 has a gain error that is a function of the signal level as shown in FIG. 13. The dynamic gain errors and the d.c. offset are corrected by the amplifier section 130. Since the output from the P—P detector 92 changes only a small amount from its nominal d.c. level, it is enough that the gain error is corrected using a first-order approximation at the desired nominal operating point, represented by a circle on the $V_{OUT}-V_{IN}$ characteristic.

Figure 14:
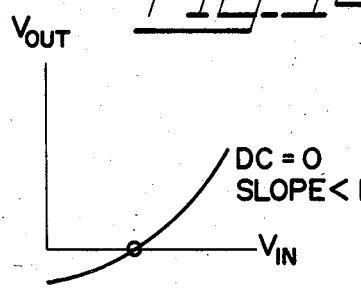

The potentiometer 124 is adjusted to bring the $V_{OUT}-V_{IN}$ characteristic to the desired level, i.e. with the output voltage of the amplifier 140 at the nominal operating point equal to zero, as shown in FIG. 14. The level detector 142 indicates the d.c. level of the peak of the envelope signal. The potentiometer 124 is used to adjust the level of the output signal of the amplifier 116, through the elements 118, 120, 122, 126, to the desired level. The adjustment of the potentiometer 124 controls the gain of the multiplier 136 via the amplifier 132.

Figure 15:
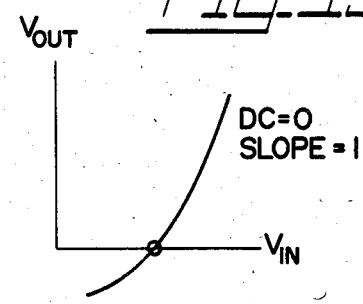

In order to correct the gain error of the P—P detector 92, the controllers 120, 122, 128 and 134 are previously calibrated to proper values. Since the voltage from the level controller 124 is zero for small signals, the large signal offset controller 122 has no effect for small signals. Therefore, if the small signal offset controller 120 is adjusted before the large signal offset controller 122 is adjusted, no further interactive adjustment is necessary. Since the $V_{in}-V_{out}$ characteristic of the P—P detector 92 is curved and the slope is less than one as shown in FIG. 13, the curve is offset by the level controller 124 to bring the operating point of interest (illustrated by circles in FIGS. 13, 14 and 15) back to zero volt d.c. as shown in FIG. 14. It should be noted that the P—P detector amplifier/detector 26 (36) is intended for relative frequency response measurements (not absolute amplitude measurement). Then the same setting of the level controller 124 is used to tell the variable gain amplifier 130 what gain correction to apply to tilt the curve back to a 1:1 slope at the desired operating point as shown in FIG. 15. Thus, the gain error correction is completed at the operating point. Since the level indicator 142 includes a window comparator which detects a small level range having zero volt, it is easy to adjust the level controller 124. The frequency domain characteristic of the SUT can be measured accurately by use of P—P detector/amplifier 26 (36) as well as digital sweep generator 20.

FIG. 16 shows a detailed circuit diagram of the amplifier section of the P—P detector/amplifier 26. The amplifiers 116, 118, 126 and 138 may be type LM308 IC and the variable gain amplifier (multiplier) 130 may be type MC1495 IC. The output from the input amplifier 116 is applied via a diode connected transistor 152 to the non-inverting input terminals of an upper limit level comparator 154 and a lower limit level comparator 156 which may be type 1458 IC. The inverting input terminals of the comparators 154 and 156 respectively receive the upper and lower limit levels from a voltage divider consisting of resistors 158 through 168 and a diode connected transistor 170. The transistors 152 and 170 compensate for temperature variation. When the output d.c. level from the input amplifier 116 is higher than the upper limit level, the outputs from the comparators 154 and 156 are both "High", causing a red LED 172 to emit light. When the output level from the input amplifier 116 is lower than the lower limit level, the outputs from the comparators 154 and 156 are both "Low", causing a red LED 176 to emit light. When the output level from the input amplifier 116 is between the lower and upper limit levels, the outputs from the comparators 154 and 156 are respectively "Low" and "High", causing a green LED 174 to emit light. Therefore, the operator can adjust the level controller 124 to the proper value by observing the LEDs 172, 174 and 176.

It will be appreciated that the present invention is not restricted to the particular apparatus which have been described with reference to the drawings, and that variations may be made without departing from the scope of the invention as defined in the appended claims, and equivalents thereof.

I claim:

1. Peak-to-peak detection apparatus comprising a peak-to-peak detector which has an input terminal for receiving an input signal having an a.c. component and also has an output terminal and defines a signal path between the input terminal and the output terminal, said peak-to-peak detector including a first diode connected in said signal path and a second diode connected between said signal path and a reference potential level, whereby the detector generates at its output terminal an output signal having a d.c. level and representing the envelope of the input signal applied to its input terminal, said apparatus also comprising means for compensating for the effect on the operating characteristic of the detector of the change in incremental resistance of the diodes with signal level, the compensating means comprising level-shifting means for receiving the output signal of the detector and generating therefrom an output signal having a desired d.c. level, and means for amplifying the output signal of the level-shifting means by an amount dependent on the difference between the d.c. level of the output signal of the detector and said desired d.c. level.

2. Apparatus according to claim 1, wherein the level-shift means comprise a differential amplifier having a first input connected to receive the output signal of the detector and also having a second input, and an adjustable potential source for applying to said second input a d.c. offset potential dependent upon the difference between the d.c. level of the output signal of the detector and the desired d.c. level.

3. Apparatus according to claim 2, wherein the amplifying means comprise a variable gain amplifier having a signal input connected to receive the output signal of the level-shifting means and also having a control input, and the adjustable potential source comprises a source of potential at a predetermined voltage relative to said reference potential level, and means for developing said d.c. offset potential from said predetermined voltage, and wherein the apparatus further comprises means for developing a gain control signal that is dependent upon said predetermined voltage for application to the control input of the variable gain amplifier.

* * * * *